United States Patent
Tazawa

(12) 
(10) Patent No.: US 6,633,123 B2
(45) Date of Patent: Oct. 14, 2003

(54) ORGANIC ELECTROLUMINESCENCE DEVICE WITH AN IMPROVED HEAT RADIATION STRUCTURE

(76) Inventor: Hidehisa Tazawa, c/o NEC Corporation, 7-1, Shiba 5-chome, Minato-ku, Tokyo (JP)

(*) Notice: Subject to any disclaimer, the term of this patent is extended or adjusted under 35 U.S.C. 154(b) by 7 days.

(21) Appl. No.: 09/932,876

(22) Filed: Aug. 21, 2001

(65) Prior Publication Data

US 2002/0043929 A1 Apr. 18, 2002

(30) Foreign Application Priority Data

Aug. 22, 2000 (JP) ......................... 2000-250903

(51) Int. Cl.⁷ .................... H01J 1/62; H01J 63/04
(52) U.S. Cl. .............. 313/506; 313/507; 313/508; 430/14; 430/15; 430/200
(58) Field of Search ................ 313/506, 507, 313/508, 509; 430/14, 15, 200

(56) References Cited

U.S. PATENT DOCUMENTS 6,291,116 B1 * 9/2001 Wolk et al. .................. 430/14

FOREIGN PATENT DOCUMENTS

| JP | 05129082 A | * 5/1993 | H05B/33/22 |
| JP | 07111192 A | * 4/1995 | H05B/33/26 |
| JP | 10144468 A | * 5/1998 | H05B/33/02 |
| JP | 10144469 A | * 5/1998 | H05B/33/02 |
| JP | 10214683 A | * 8/1998 | H05B/33/22 |
| JP | 10275681 A | * 10/1998 | H05B/33/04 |
| JP | 2000048951 A | * 2/2000 | H05B/33/02 |

* cited by examiner

Primary Examiner—Vip Patel
Assistant Examiner—Kevin Quarterman

(57) ABSTRACT

The present invention provides an organic electroluminescence device including a base structure and at least an organic electroluminescence device structure over the base structure, wherein the base structure includes a substrate made of a plastic material, and at least a heat radiation layer which is higher in heat conductivity than the substrate.

20 Claims, 4 Drawing Sheets

ORGANIC ELECTROLUMINESCENCE DEVICE WITH AN IMPROVED HEAT RADIATION STRUCTURE

BACKGROUND OF THE INVENTION

1. Field of the Invention

The present invention relates to an organic electroluminescence device, and more particularly to an organic electroluminescence device with an improved heat radiation structure.

2. Description of the Related Art

Electroluminescence devices are classified into an inorganic electroluminescence device and an organic electroluminescence. The organic electroluminescence is more advantageous than the inorganic electroluminescence device in view of a low voltage driving, a high brightness, and three primary color luminescence. The organic electroluminescence has been on the aggressive developments for application to a flat panel display and a surface light source.

FIG. 1 is a fragmentary cross sectional elevation view of a conventional electroluminescence device. The conventional electroluminescence device has the following structure. An anode layer 6 overlies a glass substrate 20. A hole transport layer 7 overlies the anode layer 6. A luminescence layer 8 overlies the hole transport layer 7. An electron transport layer 9 overlies the luminescence layer 8. A cathode layer 10 overlies the electron transport layer 9.

Organic materials are available for the hole transport layer 7, the luminescence layer 8 and the electron transport layer 9. Holes are injected from the anode layer 6 into the luminescence layer 8. Electrons are injected from the cathode layer 10 into the luminescence layer 8. The injected holes and electrons are re-combined in the luminescence layer 8 for causing a luminescence.

Some of the organic materials, which are available for the hole transport layer 7, the luminescence layer 8 and the electron transport layer 9, show cohesion and crystallization at a low temperature of about 100° C. When the organic electroluminescence device is driven at a current density of about a few hundreds mA/cm$^2$, a local heat generation is caused for deteriorating characteristics or performances of the organic electroluminescence device.

To have solved the above problems, the following conventional proposals have been made. Japanese laid-open patent publication No. 5-129082 discloses that a metal oxide with a high heat conductivity is added to a glass substrate, so that the glass substrate has an improved heat conductivity. Japanese laid-open patent publication No. 10-144468 discloses that a sapphire substrate or a quartz substrate is used due to those high heat conductivity. Japanese laid-open patent publications Nos. 7-111192 and 10-275681 disclose that a heat radiation layer is provided over a cathode for improving the device in heat radiation characteristic.

Japanese laid-open patent publications Nos. 10-144469, 10-214683, and 2000-48951 disclose that the organic electroluminescence device is provided over a plastic substrate. The plastic substrate is superior than the glass substrate in shock resistivity, light weight and reduced thickness. Thus, the plastic substrate is more suitable than the glass substrate as a mounting substrate for the organic electroluminescence device for application to mobile terminal displays and flexible displays. For those reasons, the plastic substrate is attractive.

The plastic substrate is, however, smaller in heat conductivity than the glass substrate, for which reason the organic electroluminescence device with the plastic substrate is inferior in heat radiation characteristic than the organic electroluminescence device with the glass substrate. As compared to the organic electroluminescence device with the glass substrate, the organic electroluminescence device with the plastic substrate is likely to be deteriorated in characteristic at a relatively low driving current density.

Thus, the organic electroluminescence device with the plastic substrate is lower than the organic electroluminescence device with the glass substrate in the upper limit driving current density for avoiding the deterioration in characteristic. A brightness of the organic electroluminescence device depends on the driving current density. The maximum brightness of the organic electroluminescence device is limited by the upper limit driving current density for avoiding the deterioration in characteristic. Thus, the organic electroluminescence device with the plastic substrate is lower in the maximum brightness than the organic electroluminescence device with the glass substrate. Further, the organic electroluminescence device with the plastic substrate is shorter in life-time under continuous driving condition than the organic electroluminescence device with the glass substrate.

The heat radiation layer over the cathode of the organic electroluminescence device provides a beat radiation effect which is, however, insufficient for solving the above problems with the use of the plastic substrate.

In the above circumstances, the development of a novel organic electroluminescence device with a plastic substrate and an improved heat radiation structure, which is free from the above problems, is desirable.

SUMMARY OF THE INVENTION

Accordingly, it is an object of the present invention to provide a novel organic electroluminescence device with a plastic substrate and an improved heat radiation structure, which is free from the above problems.

It is a further object of the present invention to provide a novel organic electroluminescence device with a plastic substrate and an improved heat radiation structure which suppresses an excess local temperature increase.

It is a still further object of the present invention to provide a novel organic electroluminescence device with a plastic substrate and an improved heat radiation structure for allowing a high maximum brightness.

It is yet a further object of the present invention to provide a novel organic electroluminescence device with a plastic substrate and an improved heat radiation structure allowing a long life-time under continuous driving conditions.

It is further more object of the present invention to provide a novel organic electroluminescence device with an improved heat radiation structure and a plastic substrate, wherein the organic electroluminescence device is superior in shock resistivity.

It is moreover object of the present invention to provide a novel organic electroluminescence device with an improved heat radiation structure and a plastic substrate, wherein the organic electroluminescence device is superior in light weight.

It is still more object of the present invention to provide a novel organic electroluminescence device with an improved heat radiation structure and a plastic substrate, wherein the organic electroluminescence device is superior in reduced thickness.

It is yet more object of the present invention to provide a novel organic electroluminescence device with an improved heat radiation structure and a plastic substrate, wherein the organic electroluminescence device is suitable for mobile terminal displays and flexible displays.

It is an additional object of the present invention to provide a novel heat radiation structure of an organic electroluminescence device with a plastic substrate free from the above problems.

It is a further additional object of the present invention to provide a novel heat radiation structure, of an organic electroluminescence device with a plastic substrate, wherein the heat radiation structure suppresses an excess local temperature increase.

It is further more additional object of the present invention to provide a novel heat radiation structure of an organic electroluminescence device with a plastic substrate, wherein the heat radiation structure allows a high maximum brightness.

It is moreover additional of the present invention to provide a novel heat radiation structure of an organic electroluminescence device with a plastic substrate, wherein the heat radiation structure allows a long life-time under continuous driving conditions.

The present invention provides an organic electroluminescence device including a base structure and at least an organic electroluminescence device structure over the base structure, wherein the base structure includes a substrate made of a plastic material, and at least a heat radiation layer which is higher in heat conductivity than the substrate.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DETAILED DESCRIPTION OF THE PREFERRED EMBODIMENTS

Figure 1:
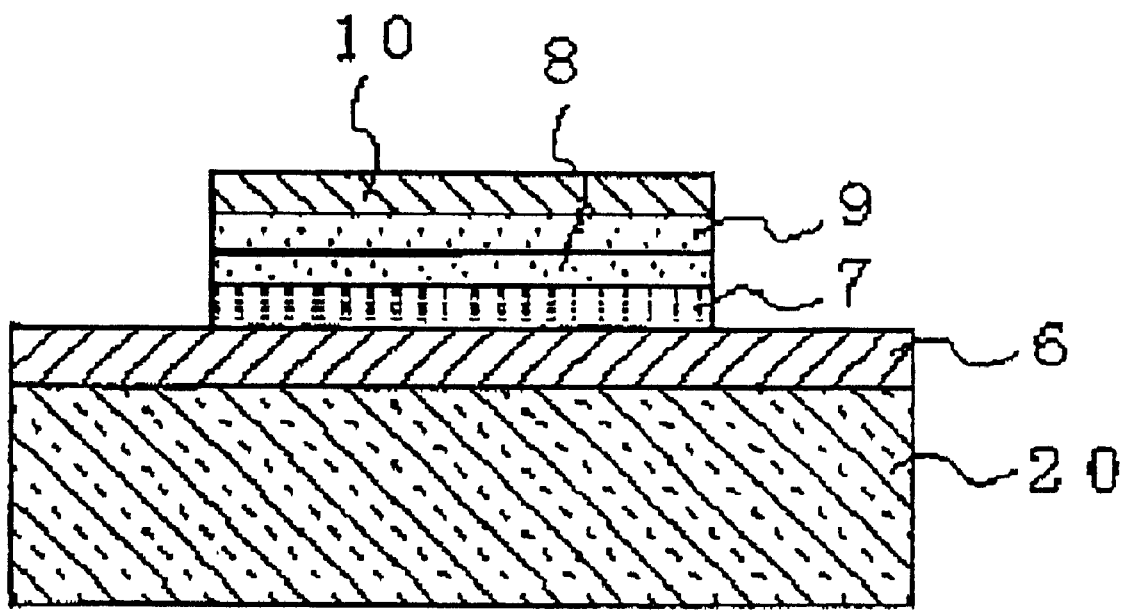
FIG. 1 is a fragmentary cross sectional elevation view of a conventional electroluminescence device.

A first aspect of the present invention is an organic electroluminescence device including a base structure and at least an organic electroluminescence device structure over the base structure, wherein the base structure includes a substrate made of a plastic material, and at least a heat radiation layer which is higher in heat conductivity than the substrate.

It is preferable that the at least heat radiation layer is disposed between the substrate and the at least organic electroluminescence device structure.

It is also preferable that the at least heat radiation layer comprises an oxide.

It is also preferable that the at least heat radiation layer comprises a nitride.

It is also preferable that the at least heat radiation layer comprises a heat conductive and electrically conductive material.

It is also preferable that the at least an organic electroluminescence device structure comprises a single organic electroluminescence device over the base structure.

It is also preferable that the at least an organic electroluminescence device structure comprises a plurality of organic electroluminescence devices over the base structure, and the organic electroluminescence devices are isolated from each other by isolation layers over the base structure.

It is also preferable that the isolation layers are thicker than anode layers of the organic electroluminescence devices. The isolation layers which are higher in heat conductivity than the substrate, so that the isolation layers serve as heat radiator in addition to the heat radiation layer.

It is also preferable that the base structure further includes at least a gas barrier layer.

The heat radiation layer suppresses an excess local temperature increase. The heat radiation layer allows a high maximum brightness. The heat radiation layer allows a long life-time under continuous driving conditions. The plastic substrate is superior in shock resistivity. The plastic substrate is also superior in light weight. The organic electroluminescence device is superior in reduced thickness. The organic electroluminescence device is suitable for mobile terminal displays and flexible displays.

A second aspect of the present invention is an organic electroluminescence device including a base structure and at least an organic electroluminescence device structure over the base structure, wherein the base structure includes a substrate made of a plastic material, and at least a heat radiation layer which is interposed between the at least an organic electroluminescence device structure and the substrate.

It is preferable that the at least heat radiation layer is higher in heat conductivity than the substrate.

It is also preferable that the at least heat radiation layer comprises an oxide.

It is also preferable that the at least heat radiation layer comprises a nitride.

It is also preferable that the at least heat radiation layer comprises a heat conductive and electrically conductive material.

It is also preferable that the at least an organic electroluminescence device structure comprises a single organic electroluminescence device over the base structure.

It is also preferable that the at least an organic electroluminescence device structure comprises a plurality of organic electroluminescence devices over the base structure, and the organic electroluminescence devices are isolated from each other by isolation layers over the base structure.

It is also preferable that the isolation layers are thicker than anode layers of the organic electroluminescence devices. The isolation layers which are higher in heat conductivity than the substrate, so that the isolation layers serve as heat radiator in addition to the heat radiation layer.

It is also preferable that the base structure further includes at least a gas barrier layer.

This second aspect of the present invention has the same characteristics described above in connection with the first aspect of the present invention.

First Embodiment

Figure 2:
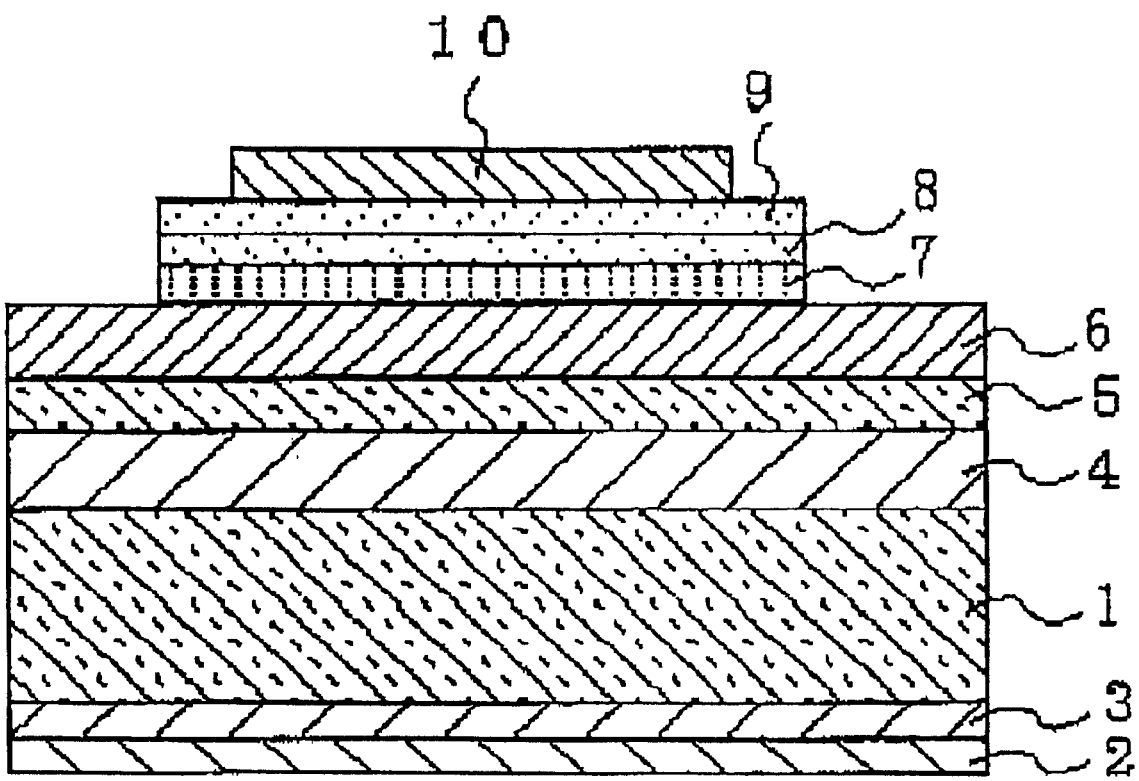
FIG. 2 is a fragmentary cross sectional elevation view of a first novel electroluminescence device with a plastic substrate and an improved heat radiation structure in a first embodiment in accordance with the present invention.

A first embodiment according to the present invention will be described in detail with reference to the drawings. FIG. 2 is a fragmentary cross sectional elevation view of a first novel electroluminescence device with a plastic substrate and an improved heat radiation structure in a first embodiment in accordance with the present invention.

The first novel electroluminescence device is provided over a plastic substrate 1. A gas barrier layer 3 underlies a bottom surface of the plastic substrate 1 for suppressing diffusions of moisture and volatile substances from the plastic substrate 1. A coat layer 2 underlies the gas barrier layer 3 for protecting the gas barrier layer 3 from damage. A heat radiation layer 4 overlies a top surface of the plastic substrate 1. An insulating layer 5 overlies the heat radiation layer 4. An anode layer 6 overlies the insulating layer 5. A hole transport layer 7 overlies the anode layer 6. A luminescence layer 8 overlies the hole transport layer 7. An electron transport layer 9 overlies the luminescence layer 8. A cathode layer 10 overlies the electron transport layer 9.

Accordingly, the above electroluminescence device comprises a base region and a device region, wherein the base region includes the plastic substrate 1 and the heat radiation layer 4. The device region comprises the anode layer 6, the hole transport layer 7, the luminescence layer 8, the electron transport layer 9 and the cathode layer 10. The base region includes essentially the plastic substrate 1 and the heat radiation layer 4, and optionally the gas barrier layer 3, the coat layer 2, and the insulating layer 5. It is necessary that the heat radiation layer 4 is interposed between the plastic substrate 1 and the device region.

As a modification, the gas barrier layer 3 may be provided on the top surface of the plastic substrate 1. Also, the gas barrier layers 3 may be provided both on the top and bottom surfaces of the plastic substrate 1. If there is substantially no problem with the diffusion of moisture from the plastic substrate 1, it is possible that the gas barrier layer 3 and the coat layer 2 are not provided. If an electrical insulation between the heat radiation layer 4 and the anode layer 6 is unnecessary, then it is possible that the insulating layer 5 is not provided.

The plastic substrate 1 may be made of various plastic materials, for example, polyethyleneterephthalate, polyethylene-2,6-naphthalate, polycarbonate, polysulfone, polyethersulfone, polyarylate, fluoro resin, polypropylene, polyimide resin, and epoxy resin. A thickness of the plastic substrate 1 is optional, but preferably in the range of 0.05 mm to 1 mm. It is preferable that the plastic substrate 1 has a visible light transmittivity of not less than 10%.

For a material of the gas barrier layer 3, various materials, for example, $SiO_x$, $Al_2O_3$, and $SiO_N$ may be available. The gas barrier layer 3 may be formed on the substrate 1 by various methods, for example, a vacuum evaporation method, a sputtering method, and an ion-plating method. A thickness of the gas barrier layer 3 may be decided so that a moisture transmittivity of the substrate 1 is not more than 2 g m$^{-2}$ day atm. Further, $TiO_2$ may be available for the coat layer 2.

The heat radiation layer 4 is provided between the substrate 1 and the device region. The heat radiation layer 4 is made of a material having a higher heat conductivity than the plastic substrate 1. It is preferable that the heat conductivity of the heat radiation layer 4 is higher by at least one order than the heat conductivity of the plastic substrate 1. If the plastic substrate 1 is made of polycarbonate which has a heat conductivity of 0.2 W/m·K, then it is preferable that Ag, Au, Al, SiC, BeO, AlN, $Al_2O_3$ are, for example, available. The heat radiation layer 4 may be formed on the substrate 1 by various methods, for example, a vacuum evaporation method, an ion sputtering method, and an ion-plating method.

The insulating layer 5 may be made of various materials, for example, $SiO_x$, $Al_3N_4$, and $Al_2O_3$ may be available. The insulating layer 5 may be formed on the beat radiation layer 4 by various methods, for example, a vacuum evaporation method, a sputtering method, and an ion-plating method.

As described above, the electroluminescence device comprises the device region and the base region. The device region includes the anode layer 6, the hole transport layer 7, the luminescence layer 8, the electron transport layer 9, and the cathode layer 10. This structure of the device region may be modified to any available structures for performing as the electroluminescence device. The present invention improves the base region, which comprise the coat layer 2, the gas barrier layer 3, the plastic substrate 1, the heat radiation layer 4, and the insulating layer 5. The structure of the base region may also be modified to other available lamination structures as long as the beat radiation layer 4 is interposed between the plastic substrate 1 and the device region. Namely, the provisions of the gas barrier layer 3, the coat layer 2 and the insulating layer 5 may be optional. For example, the following lamination structures are available.

The first lamination structure is as follows. A bottom coat layer is provided on a bottom surface of the plastic substrate. A top coat layer is provided on a top surface of the plastic substrate. A heat radiation layer is provided over the top coat layer. The device region is provided over the heat radiation layer The second lamination structure is as follows. A bottom coat layer is provided on a bottom surface of the plastic substrate. A top coat layer is provided on a top surface of the plastic substrate. A heat radiation layer is provided over the top coat layer. An insulating layer is provided over the heat radiation layer. The device region is provided over the insulating layer.

The third lamination structure is as follows. A bottom coat layer is provided on a bottom surface of a gas barrier layer. The gas barrier layer is provided on a bottom surface of the plastic substrate. A top coat layer is provided on a top surface of the plastic substrate. A heat radiation layer is provided over the top coat layer. The device region is provided over the heat radiation layer.

The fourth lamination structure is as follows. A bottom coat layer is provided on a bottom surface of a gas barrier layer. The gas barrier layer is provided on a bottom surface of the plastic substrate. A top coat layer is provided on a top surface of the plastic substrate. A heat radiation layer is provided over the top coat layer. An insulating layer is provided over the heat radiation layer. The device region is provided over the insulating layer.

The fifth lamination structure is as follows. A bottom coat layer is provided on a bottom surface of a bottom gas barrier layer. The bottom gas barrier layer is provided on a bottom surface of the plastic substrate. A top gas barrier layer is provided on a top surface of the plastic substrate. A top coat layer is provided on a top surface of the top gas barrier layer. A heat radiation layer is provided over the top coat layer. The device region is provided over the heat radiation layer.

The sixth lamination structure is as follows. A bottom coat layer is provided on a bottom surface of a bottom gas barrier layer. The bottom gas barrier layer is provided on a bottom surface of the plastic substrate. A top gas barrier layer is provided on a top surface of the plastic substrate. A top coat layer is provided on a top surface of the top gas barrier layer. A heat radiation layer is provided over the top coat layer. An insulating layer is provided over the heat radiation layer. The device region is provided over the insulating layer.

The anode layer 6 is made of a conductive material which allows a hole injection into the hole transport layer 7. If the luminescent light is fetched through the plastic substrate 1, the luminescent light is transmitted through the anode layer 6, for which reason it is preferable that the anode layer 6 has a visible light transmittivity of not less than 10%. Various transparent conductive materials such as indium tin oxide and $SnO_2$ are available. In view of reducing the power consumption and the heat generation, it is preferable that the anode layer 6 has a low resistance. The anode layer 6 may be formed by any available methods such as a vacuum evaporation method, a sputtering method and an ion-plating method.

The hole transport layer 7 may be made of a material which allows a highly efficient hole transport to the luminescent layer 8. This material is also preferably suitable to be in a form of a thin film. For example, aromatic tertiary amine derivatives, and phthalocyanine derivatives are available. It is not necessary to limit the selectivity of the material to these examples. The hole transport layer 7 may comprise either a single layered structure or plural layered structure.

The luminescence layer 8 is made of a luminescent material which is optionally doped with a dopant. The luminescent material allows an efficient re-combination of holes and electrons and an efficient luminescence. This material is also preferably suitable to be in a form of a thin film. The dopant may optionally be doped in order to improve the luminescence efficiency, or change the luminescent color. Aluminum quinolinol complex, rubrene, quinacridone, DCM are examples of the available materials.

The electron transport layer 9 may be made of a material which allows a highly efficient electron transport to the luminescent layer 8. This material is also preferably suitable to be in a form of a thin film. For example, aluminum quinolinol complex, and triazole derivatives are available. It is not necessary to limit the selectivity of the material to these examples. The electron transport layer 9 may comprise either a single layered structure or plural layered structure. The electron transport layer 9 may be made of the same material as the luminescence material.

Each of the hole transport layer 7, the luminescence layer 8 and the electron transport layer 9 may be formed by various available methods, for example, a vacuum evaporation method, a molecular beam evaporation method, a spin coating method and LB-method.

The cathode layer 10 may be made of a material having a smaller work function and allowing an efficient electron injection into the electron transport layer 9. For example, Ag/Mg-alloy, Al/Li-alloy, $Al/Al_2O_3$ Al/LiF are available. It is not necessary to limit the selectivity of the material to these examples. The cathode layer 10 may be formed by any available methods such as a vacuum evaporation method, a sputtering method and an ion-plating method.

A voltage is applied between the anode layer 6 and the cathode layer 10 to inject holes and electrons from the anode layer 6 and the cathode layer 10 to the luminescence layer 8, wherein the injected holes and electrons are re-combined to cause the luminescence. The electroluminescence device may be driven by any one of available methods, for example, a direct current driving method, a pulse current driving method, and an alternating current driving method. The electroluminescence device may form a display device of matrix type or segment type or in combination.

EXAMPLE 1

A polycarbonate substrate 1 with a size of 50 mm×50 mm was prepared, wherein both surfaces of the polycarbonate substrate 1 have hard coats. The polycarbonate substrate 1 has a thickness of 0.4 mm and a heat conductivity of 0.2 W/mK. An SiOx heat radiation layer 4 having a thickness of 5 micrometers and a heat conductivity of 1.8 W/mK was deposited on the polycarbonate substrate 1 by a sputtering method. This SiOx heat radiation layer 4 also serves as an insulating layer. An indium thin oxide anode layer 6 having a thickness of 120 nanometers was deposited on the SiOx heat radiation layer 4 by a sputtering method. The indium thin oxide anode layer 6 was then patterned by a selective etching process into a stripe-shaped pattern with a width of 2 mm. The stripe-shaped pattern has a sheet resistance of 30 ohms/squares. The substrate 1 was subjected to ultrasonic cleanings with ethanol and pure water, and then a steam dry with isopropyl alcohol.

The organic layers were formed by a vacuum evaporation method. The substrate 1 was set on an upper portion of a vacuum chamber. A molybdenum boat was set on a lower portion of the vacuum chamber. When an internal pressure of the chamber reached a pressure of not more than 1E-4 Pa, then the evaporation was started under the control of evaporation rate by a quartz oscillator which is positioned at a side of the substrate 1. The evaporation rate was set at 0.2 nm per second. For the hole transport layer 7, alpha-naphthyl phenyl diamine (alpha-NPD) represented by the following general formula (2) was deposited at a thickness of 50 nm. For the luminescence layer 8, tris(8-quinolinol) aluminum (Alq) represented by the following general formula (1) was deposited at a thickness of 80 nm.

Alq:

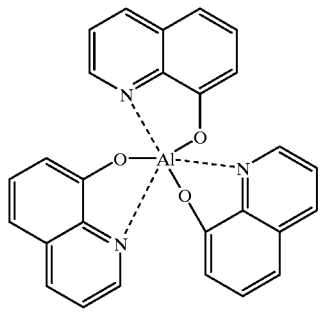

(1)

alpha-NPD:

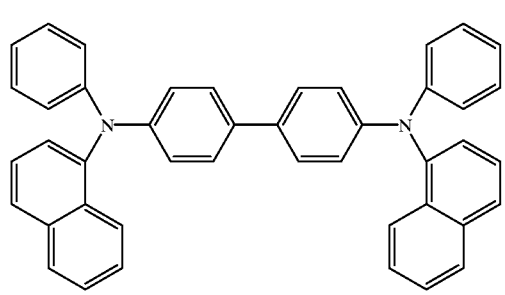

(2)

The Alq layer serves as both the luminescence layer 8 and the electron transport layer 9.

A magnesium boat and a silver boat were used for a selective evaporation using a metal mask to form a stripe-pattern of a magnesium-silver alloy cathode layer 10 having a thickness of 200 nm, wherein a magnesium evaporation rate was set at 1.0 nm per second and silver evaporation rate was set at 0.2 nm per second. The stripe pattern has a width of 2 mm and crosses the other stripe pattern of the indium tin oxide.

It was confirmed that an application of a driving voltage at 14V results in breaking the device. A maximum current density was 232 mA/cm². A maximum luminance was 3257 cd/m². The device was continuously driven by a constant current of 20 mA/cm² in nitrogen atmosphere, a luminance half-value period from an initial value of 481 cd/m² was 340 hours.

EXAMPLE 2

An electroluminescence device was prepared, which is different from the electroluminescence device of Example 1 only in that for the heat radiation layer 4, an AlN layer with a thickness of 5 micrometers was deposited by a sputtering method, and the AlN layer has a heat conductivity of 90W/mK.

It was confirmed that an application of a driving voltage at 15.5V results in breaking the device. A maximum current density was 342 mA/cm². A maximum luminance was 4784 cd/m². The device was continuously driven by a constant current of 20 mA/cm² in nitrogen atmosphere, a luminance half-value period from an initial value of 478 cd/m² was 530 hours.

EXAMPLE 3

An electroluminescence device was prepared, which is different from the electroluminescence device of Example 1 in both that for the heat radiation layer 4, an Ag layer with a thickness of 5 nanometers was deposited by a vacuum evaporation method, and the Ag layer has a heat conductivity of 429W/mK and that an SiOx insulating layer 5 with a thickness of 100 nanometers was deposited on the heat radiation layer 4 by a sputtering method.

It was confirmed that an application of a driving voltage at 15V results in breaking the device. A maximum current density was 306 mA/cm². A maximum luminance was 3176 cd/m². The device was continuously driven by a constant current of 20 mA/cm² in nitrogen atmosphere, a luminance half-value period from an initial value of 202 cd/m² was 480 hours.

Comparative Example 1

An electroluminescence device was prepared, which is different from the electroluminescence device of Example 1 in that no heat radiation layer was provided.

It was confirmed that an application of a driving voltage at 12V results in breaking the device. A maximum current density was 116 mA/cm². A maximum luminance was 2356 cd/m². The device was continuously driven by a constant current of 20 mA/cm² in nitrogen atmosphere, a luminance half-value period from an initial value of 513 cd/m² was 180 hours. No provision of the heat radiation layer results in a low maximum luminance and an unstable driving performance.

Comparative Example 2

A glass substrate 1 with a size of 50 mm×50 mm was prepared, wherein 7059-glass is used. The glass substrate 1 has a thickness of 1.1 mm and a heat conductivity of 0.8 W/mK. An indium thin oxide anode layer 6 having a thickness of 120 nanometers was deposited on the glass substrate 1 by a sputtering method The indium thin oxide anode layer 6 was then patterned by a selective etching process into a stripe-shaped pattern with a width of 2 mm. The stripe-shaped pattern has a sheet resistance of 30 ohms/squares. The glass substrate 1 was subjected to ultrasonic cleanings with ethanol and pure water, and then a steam dry with isopropyl alcohol. The organic layers and the cathode layers were formed in the same manners as in Example 1.

It was confirmed that an application of a driving voltage at 17.5V results in breaking the device. A maximum current density was 492 mA/cm². A maximum luminance was 7384 cd/m². The device was continuously driven by a constant current of 20 mA/cm² in nitrogen atmosphere, a luminance half-value period from an initial value of 501 cd/m² was 600 hours.

The heat radiation layer 4 suppresses an excess local temperature increase. The heat radiation layer 4 allows a high maximum brightness. The heat radiation layer 4 allows a long life-time under continuous driving conditions. The plastic substrate is superior in shock resistivity. The plastic substrate is also superior in light weight. The organic electroluminescence device is superior in reduced thickness. The organic electroluminescence device is suitable for mobile terminal displays and flexible displays.

Second Embodiment

Figure 3:
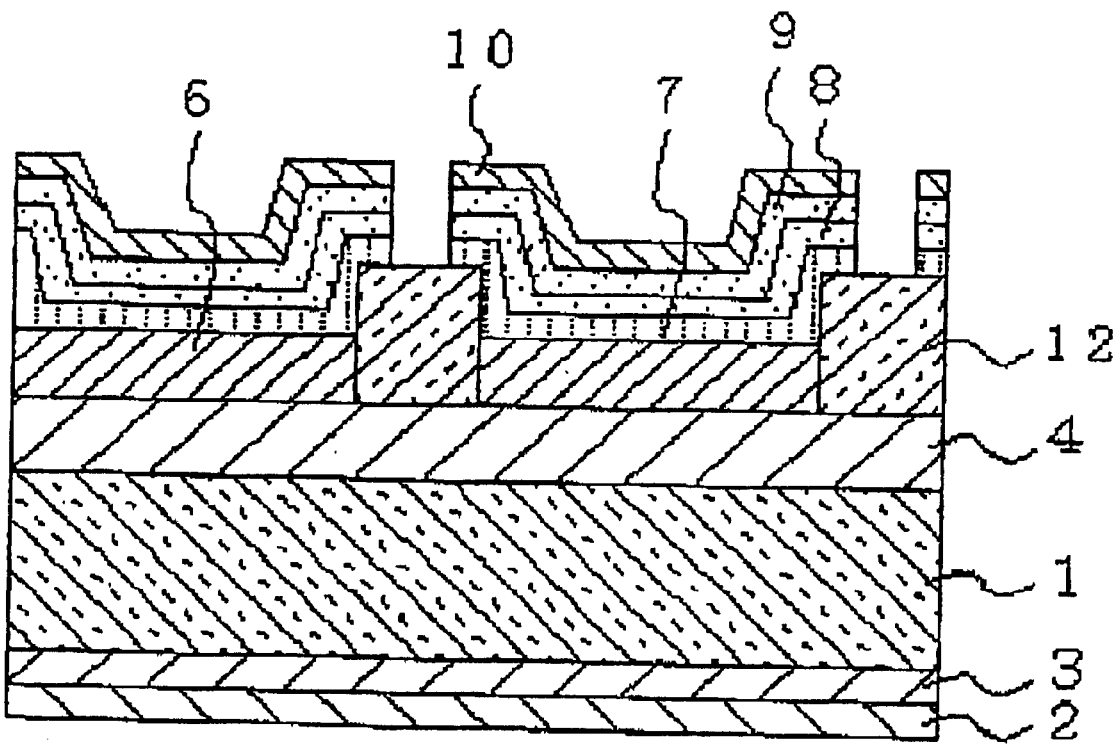
FIG. 3 is a fragmentary cross sectional elevation view of a second novel electroluminescence device with a plastic substrate and an improved heat radiation structure in a second embodiment in accordance with the present invention.

A second embodiment according to the present invention will be described in detail with reference to the drawings. FIG. 3 is a fragmentary cross sectional elevation view of a second novel electroluminescence device with a plastic substrate and an improved heat radiation structure in a second embodiment in accordance with the present invention.

The second novel electroluminescence device is provided over a plastic substrate 1. A gas barrier layer 3 underlies a bottom surface of the plastic substrate 1 for suppressing diffusions of moisture and volatile substances from the plastic substrate 1. A coat layer 2 underlies the gas barrier layer 3 for protecting the gas barrier layer 3 from damage. A heat radiation layer 4 overlies a top surface of the plastic substrate 1. A plurality of anode layers 6 are selectively provided on a top surface of the heat radiation layer 4. The heat radiation layer 4 is made of an insulating material such as SiOx, $Si_3N_4$, and $Al_2O_3$.

The plurality of anode layers 6 are separated from each other by insulating layers 12 which are also selectively provided on the top surface of the heat radiation layer 4. The insulating layers 12 is thicker than the plurality of anode layers 6. A plurality of hole transport layers 7 overly the anode layers 6. Each of the anode layers 6 is contact with the heat radiation layer 4, the insulating layers 12 and the hole transport layers 7. Each of the insulating layers 12 is contact with the heat radiation layer 4, the anode layers 6 and the hole transport layers 7. A plurality of luminescence layers 8 overly the hole transport layers 7. A plurality of electron transport layers 9 overly the luminescence layers 8. A plurality of cathode layers 10 overly the electron transport layers 9.

Accordingly, the above electroluminescence device comprises a base region and a plurality of device regions separated by the insulating layers 12 and provided over the base region, wherein the base region includes the plastic substrate 1 and the heat radiation layer 4. Each of the device regions comprises the anode layer 6, the hole transport layer 7, the luminescence layer 8, the electron transport layer 9 and the cathode layer 10. The base region includes essentially the plastic substrate 1 and the heat radiation layer 4, and optionally the gas barrier layer 3, and the coat layer 2. It is necessary that the heat radiation layer 4 is interposed between the plastic substrate 1 and the device region.

The provision of the insulating layers 12 prevents any leakage of current from the anode layers 6 and also improves the display contrast of the organic electroluminescence device. It is preferable that the insulating layers 12 are made of an insulating material having a high heat conductivity to improve the heat radiation effect, Oxides such as SiOx, and $Al_2O_3$, nitrides such as $Si_3N_4$ and AlN, and a heat conductive polyimide resin material are, for example, available.

The anode layers 6, the organic layers 7, 8 and 9 and the cathode layers 10 may be formed in the same manners as in the first embodiment.

The heat radiation layer 4 suppresses an excess local temperature increase. The heat radiation layer 4 allows a high maximum brightness. The heat radiation layer 4 allows a long life-time under continuous driving conditions. The plastic substrate is superior in shock resistivity. The plastic substrate is also superior in light weight. The organic electroluminescence device is superior in reduced thickness. The organic electroluminescence device is suitable for mobile terminal displays and flexible displays.

Third Embodiment

Figure 4:
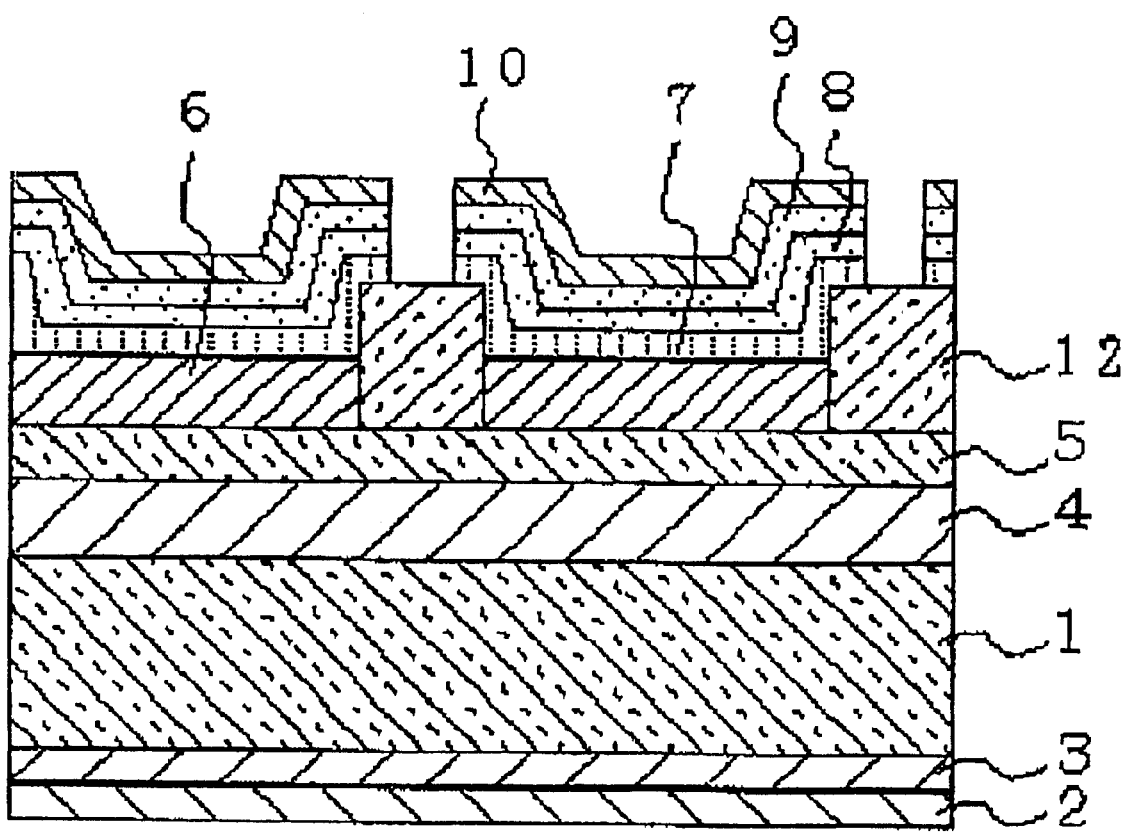
FIG. 4 is a fragmentary cross sectional elevation view of a third novel electroluminescence device with a plastic substrate and an improved heat radiation structure in a third embodiment in accordance with the present invention.

A third embodiment according to the present invention will be described in detail with reference to the drawings. FIG. 4 is a fragmentary cross sectional elevation view of a third novel electroluminescence device with a plastic substrate and an improved heat radiation structure in a third embodiment in accordance with the present invention.

The third novel electroluminescence device is provided over a plastic substrate 1. A gas barrier layer 3 underlies a bottom surface of the plastic substrate 1 for suppressing diffusions of moisture and volatile substances from the plastic substrate 1. A coat layer 2 underlies the gas barrier layer 3 for protecting the gas barrier layer 3 from damage. A heat radiation layer 4 overlies a top surface of the plastic substrate 1. A plurality of anode layers 6 are selectively provided on a top surface of the heat radiation layer 4. The heat radiation layer 4 is made of an electrically conductive material such as Ag, Au and Al. Further, an insulating layer 5 overlies a top surface of the heat radiation layer 4. The insulating layer 5 is made of an insulating material such as SiOx, $Si_3N_4$, and $Al_2O_3$.

The plurality of anode layers 6 are separated from each other by insulating layers 12 which are also selectively provided on the top surface of the insulating layer 5. The insulating layers 12 is thicker than the plurality of anode layers 6. A plurality of hole transport layers 7 overly the anode layers 6. Each of the anode layers 6 is contact with the insulating layer 5, the insulating layers 12 and the hole transport layers 7. Each of the insulating layers 12 is contact with the insulating layer 5, the anode layers 6 and the hole transport layers 7. A plurality of luminescence layers 8 overly the hole transport layers 7. A plurality of electron transport layers 9 overly the luminescence layers 8. A plurality of cathode layers 10 overly the electron transport layers 9.

Accordingly, the above electroluminescence device comprises a base region and a plurality of device regions separated by the insulating layers 12 and provided over the base region, wherein the base region includes the plastic substrate 1 and the heat radiation layer 4. Each of the device regions comprises the anode layer 6, the hole transport layer 7, the luminescence layer 8, the electron transport layer 9 and the cathode layer 10. The base region includes essentially the plastic substrate 1 and the heat radiation layer 4, and optionally the gas barrier layer 3, the coat layer 2, and the insulating layer 5. It is necessary that the heat radiation layer 4 is interposed between the plastic substrate 1 and the device region.

The provision of the insulating layers 12 prevents any leakage of current from the anode layers 6 and also improves the display contrast of the organic electroluminescence device. It is preferable that the insulating layers 12 are made of an insulating material having a high heat conductivity to improve the heat radiation effect. Oxides such as SiOx, and $Al_2O_3$, nitrides such as $Si_3N_4$ and AlN, and a heat conductive polyimide resin material are, for example, available.

The anode layers 6, the organic layers 7, 8 and 9 and the cathode layers 10 may be formed in the same manners as in the first embodiment.

The heat radiation layer 4 suppresses an excess local temperature increase. The heat radiation layer 4 allows a high maximum brightness. The heat radiation layer 4 allows a long life-time under continuous driving conditions. The plastic substrate is superior in shock resistivity. The plastic substrate is also superior in light weight. The organic electroluminescence device is superior in reduced thickness. The organic electroluminescence device is suitable for mobile terminal displays and flexible displays.

Although the invention has been described above in connection with several preferred embodiments therefor, it will be appreciated that those embodiments have been provided solely for illustrating the invention, and not in a limiting sense. Numerous modifications and substitutions of equivalent materials and techniques will be readily apparent to those skilled in the art after reading the present application, and all such modifications and substitutions are expressly understood to fall within the true scope and spirit of the appended claims.

What is claimed is:

1. An organic electroluminescence device including: a base structure and at least an organic electroluminescence device structure over said base structure, wherein said base structure includes a substrate made of a plastic material, and at least a heat radiation layer which is higher in heat conductivity than said substrate, and said at least heat radiation layer is disposed between said substrate and said at least organic electroluminescence device structure.

2. The organic electroluminescence device as claimed in claim 1, wherein said at least heat radiation layer comprises an oxide.

3. The organic electroluminescence device as claimed in claim 1, wherein said at least heat radiation layer comprises a nitride.

4. The organic electroluminescence device as claimed in claim 1, wherein said at least heat radiation layer comprises a heat conductive and electrically conductive material.

5. The organic electroluminescence device as claimed in claim 1, wherein said at least an organic electroluminescence device structure comprises a single organic electroluminescence device over said base structure.

6. The organic electroluminescence device as claimed in claim 1, wherein said at least an organic electroluminescence device structure comprises a plurality of organic electroluminescence devices over said base structure, and said organic electroluminescence devices are isolated from each other by isolation layers over said base structure.

7. The organic electroluminescence device as claimed in claim 1, wherein said isolation layers are vertically thicker than anode layers of said organic electroluminescence devices.

8. The organic electroluminescence device as claimed in claim 7, wherein said isolation layers are higher in heat conductivity than said substrate, so that said isolation layers serve as a heat radiator in addition to said heat radiation layer.

9. The organic electroluminescence device as claimed in claim 1, wherein said base structure further includes at least a gas barrier layer.

10. An organic electroluminescence device including: a base structure and at least an organic electroluminescence device structure over said base structure, wherein said base structure includes a substrate made of a plastic material, and at least a heat radiation layer which is interposed between said at least an organic electroluminescence device structure and said substrate.

11. The organic electroluminescence device as claimed in claim 10, wherein said at least heat radiation layer is higher in heat conductivity than said substrate by at least one order.

12. The organic electroluminescence device as claimed in claim 10, wherein said at least heat radiation layer comprises an oxide.

13. The organic electroluminescence device as claimed in claim 10, wherein said at least heat radiation layer comprises a nitride.

14. The organic electroluminescence device as claimed in claim 10, wherein said at least heat radiation layer comprises a heat conductive and electrically conductive material.

15. The organic electroluminescence device as claimed in claim 10, wherein said at least an organic electroluminescence device structure comprises a single organic electroluminescence device over said base structure.

16. The organic electroluminescence device as claimed in claim 10, wherein said at least an organic electroluminescence device structure comprises a plurality of organic electroluminescence devices over said base structure, and said organic electroluminescence devices are isolated from each other by isolation layers over said base structure, said isolation layers being higher in heat conductivity than said substrate.

17. The organic electroluminescence device as claimed in claim 10, wherein said isolation layers are vertically thicker than anode layers of said organic electroluminescence devices.

18. The organic electroluminescence device as claimed in claim 17, wherein said isolation layers which are higher in heat conductivity than said substrate, so that said isolation layers serve as a heat radiator in addition to said heat radiation layer.

19. The organic electroluminescence device as claimed in claim 11, wherein said base structure further includes at least a gas barrier layer.

20. An organic electroluminescence device, comprising:

a plastic substrate;

a heat radiation layer overlying the plastic substrate;

an electrical insulation layer overlying the heat radiation layer;

an anode layer overlying the glass substrate;

a hole transport layer of an organic material overlying the anode layer;

an luminescence layer overlying the hole transport layer;

an electron transport layer overlying the luminescence layer; and a cathode layer overlying the electron transport layer, wherein, the plastic substrate, the heat radiation layer, and the electrical insulation layer comprise a base region, the anode layer, the hole transport layer, the luminescence layer, the electron transport layer and the cathode layer comprise a device region, and the heat radiation layer is higher in heat conductivity than the plastic substrate.

\* \* \* \* \*